US008623224B2

(12) United States Patent
Cheng et al.

(10) Patent No.: US 8,623,224 B2
(45) Date of Patent: *Jan. 7, 2014

(54) METHOD FOR MAKING PATTERNED CONDUCTIVE ELEMENT

(75) Inventors: Jia-Shyong Cheng, New Taipei (TW); Po-Shan Huang, New Taipei (TW); Po-Sheng Shih, New Taipei (TW); Chun-Yi Hu, New Taipei (TW); Chih-Han Chao, New Taipei (TW); Jeah-Sheng Wu, New Taipei (TW)

(73) Assignee: Shih Hua Technology Ltd., Zhubei, Hsinchu County (TW)

( * ) Notice: Subject to any disclaimer, the term of this patent is extended or adjusted under 35 U.S.C. 154(b) by 78 days.

This patent is subject to a terminal disclaimer.

(21) Appl. No.: 13/339,703

(22) Filed: Dec. 29, 2011

(65) Prior Publication Data

US 2012/0312773 A1  Dec. 13, 2012

(30) Foreign Application Priority Data

Jun. 9, 2011  (TW) .............................. 100120203 A

(51) Int. Cl.
  *H01B 13/00*  (2006.01)
  *B32B 37/00*  (2006.01)
  *B32B 38/10*  (2006.01)

(52) U.S. Cl.
  USPC .................. 216/13; 216/20; 216/65; 156/247

(58) Field of Classification Search
  USPC .......... 216/20, 13, 65; 156/247, 272.2, 273.3, 156/273.9
  See application file for complete search history.

(56) References Cited

U.S. PATENT DOCUMENTS

| 2010/0271330 | A1  | 10/2010 | Philipp |
| 2012/0312771 | A1* | 12/2012 | Cheng et al. .................... 216/13 |
| 2012/0312776 | A1* | 12/2012 | Cheng et al. .................... 216/20 |

FOREIGN PATENT DOCUMENTS

| CN | 101625617 | 1/2010 |
| TW | 200636588 | 10/2006 |
| TW | 201113583 | 4/2011 |

\* cited by examiner

*Primary Examiner* — Duy Deo
*Assistant Examiner* — Mahmoud Dahimene
(74) *Attorney, Agent, or Firm* — Altis Law Group, Inc.

(57) ABSTRACT

The present disclosure relates to a method for making pattern conductive element. The method includes steps. A substrate having a surface is provide. An adhesive layer is formed on the surface of the substrate. Part of the adhesive layer is solidified to form a solidified adhesive layer and a non-solidified adhesive layer. A carbon nanotube layer is applied on the adhesive layer. The non-solidified adhesive layer is solidified so that the carbon nanotube layer on the non-solidified adhesive layer forms a fixed carbon nanotube layer and the carbon nanotube layer on the solidified adhesive layer forms a non-fixed carbon nanotube layer. The non-fixed carbon nanotube layer is removed and the fixed carbon nanotube layer is remained to form a pattern carbon nanotube layer.

16 Claims, 7 Drawing Sheets

METHOD FOR MAKING PATTERNED CONDUCTIVE ELEMENT

CROSS-REFERENCE TO RELATED APPLICATIONS

This application claims all benefits accruing under 35 U.S.C. §119 from Taiwan Patent Application No. 100120203, filed on Jun. 9, 2011, in the Taiwan Intellectual Property Office, the contents of which are hereby incorporated by reference. This application is related to applications entitled, "TOUCH PANEL", filed Dec. 29, 2011 ( Ser. No. 13/339,643); and "METHOD FOR MAKING TOUCH PANEL", filed Dec. 29, 2011(Ser. No. 13/339,658); and "METHOD FOR MAKING TOUCH PANEL", filed Dec. 29, 2011 (Ser. No. 13/339,664); and "METHOD FOR MAKING TOUCH PANEL", filed Dec. 29, 2011 (Ser. No. 13/339,671); and "TOUCH PANEL AND METHOD FOR MAKING THE SAME", filed Dec. 29, 2011 (Ser. No. 13/339,678); and "METHOD FOR MAKING TOUCH PANEL", filed Dec. 29, 2011 (Ser. No. 13/339,681); and "METHOD FOR MAKING TOUCH PANEL", filed Dec. 29, 2011 (Ser. No. 13/339,688); and "PATTERNED CONDUCTIVE ELEMENT", filed Dec. 29, 2011 (Ser. No. 13/339,696); and "METHOD FOR MAKING PATTERNED CONDUCTIVE ELEMENT", filed Dec. 29, 2011 (Ser. No. 13/339,700); and "TOUCH PANEL", filed Dec, 29, 2011 (Ser. No. 13/339,709); and "TOUCH PANEL", filed Dec. 29, 2011 (Ser. No. 13/339,718).

BACKGROUND

1. Technical Field

The present disclosure relates to patterned conductive elements and method for making the same, particularly, to a carbon nanotube based patterned conductive element and a method for making the same.

2. Description of Related Art

Patterned conductive elements, especially patterned transparent conductive elements, are widely used in the electronic devices such as a touch screen, a liquid crystal display (LCD), or a field emission display (FED).

A conventional patterned transparent conductive element includes a patterned transparent conductive indium tin oxide (ITO). However, the ITO layer has poor wearability, low chemical endurance and uneven resistance in an entire area of the panel. Furthermore, the ITO layer is generally formed by means of ion-beam sputtering and etched by laser beam, and the method is relatively complicated.

What is needed, therefore, is to provide a patterned conductive element and a method for making the same which can overcome the shortcoming described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present patterned conductive elements and methods for making the same.

Figure 1:
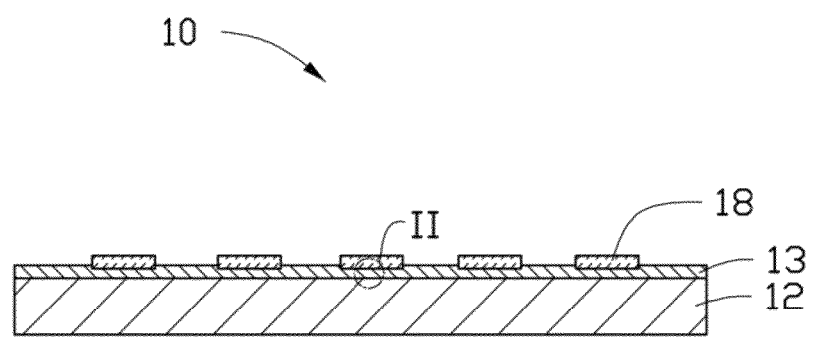
FIG. 1 is a schematic view of one embodiment of a patterned conductive element.

Referring to FIG. 1, a patterned conductive element 10 of one embodiment includes a substrate 12, an adhesive layer 13, and a patterned carbon nanotube layer 18.

The substrate 12 can be flat or curved and configured to support other elements. The substrate 12 can be insulative and transparent, opaque, or translucent.

In one embodiment, the transmittance of the substrate 12 can be greater than 75%. The substrate 12 can be made of rigid materials such as silicon, ceramic, glass, quartz, diamond, plastic or any other suitable material. The substrate 12 can also be made of flexible materials such as polycarbonate (PC), polymethyl methacrylate acrylic (PMMA), polyimide (PI), polyethylene terephthalate (PET), polyethylene (PE), polyether polysulfones (PES), polyvinyl polychloride (PVC), benzocyclobutenes (BCB), polyesters, or acrylic resin. In one embodiment, the substrate 12 is a flat and flexible PET plate.

The adhesive layer 13 is configured to fix the patterned carbon nanotube layer 18 on the substrate 12. The adhesive layer 13 can be transparent, opaque, or translucent. In one embodiment, the transmittance of the adhesive layer 13 can be greater than 75%. The adhesive layer 13 can be made of materials such as hot plastic or UV (Ultraviolet Rays) glue, for example PVC or PMMA. The thickness of the adhesive layer 13 can be in a range from about 1 nanometer to about 500 micrometers, for example, the thickness is in a range from about 1 micrometer to about 2 micrometers. In one embodiment, the adhesive layer 13 is a UV glue layer with a thickness of 1.5 micrometers.

Figure 3:
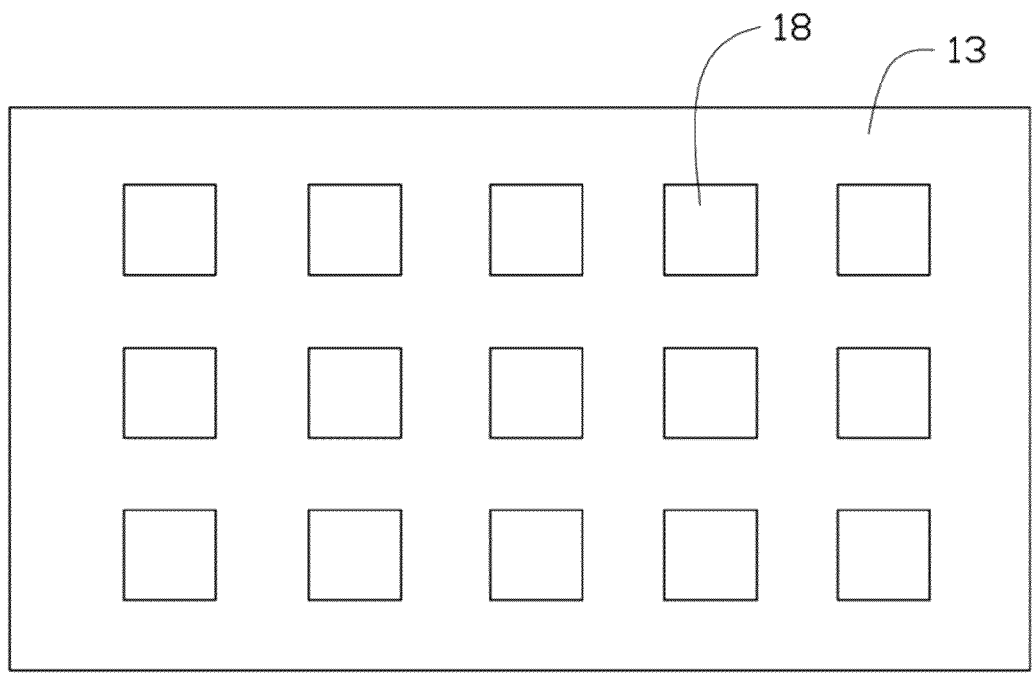
FIG. 3 is a schematic, top view of one embodiment of a patterned conductive element.
Figure 4:
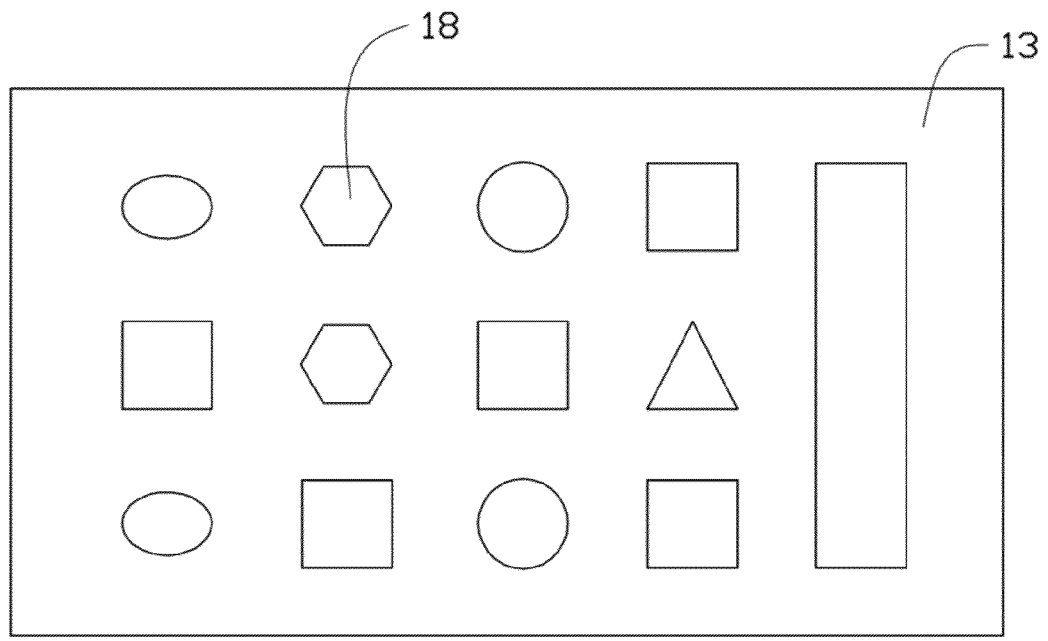
FIG. 4 is a schematic, top view of another embodiment of a patterned conductive element.

The patterned carbon nanotube layer 18 can be a continuous structure or includes a plurality of spaced carbon nanotube patterns arranged in the form of an array. The plurality of carbon nanotube patterns can be hexagonally arranged, squarely arranged, or concentrically arranged. The carbon nanotube pattern can be a triangle, parallelogram, diamond, square, trapezoid, rectangle, or circle. In one embodiment, the patterned carbon nanotube layer 18 includes a plurality of carbon nanotube patterns having the same shape as shown in FIG. 3. In one embodiment, the patterned carbon nanotube layer 18 includes a plurality of carbon nanotube patterns having different shapes as shown in FIG. 4.

Figure 2:
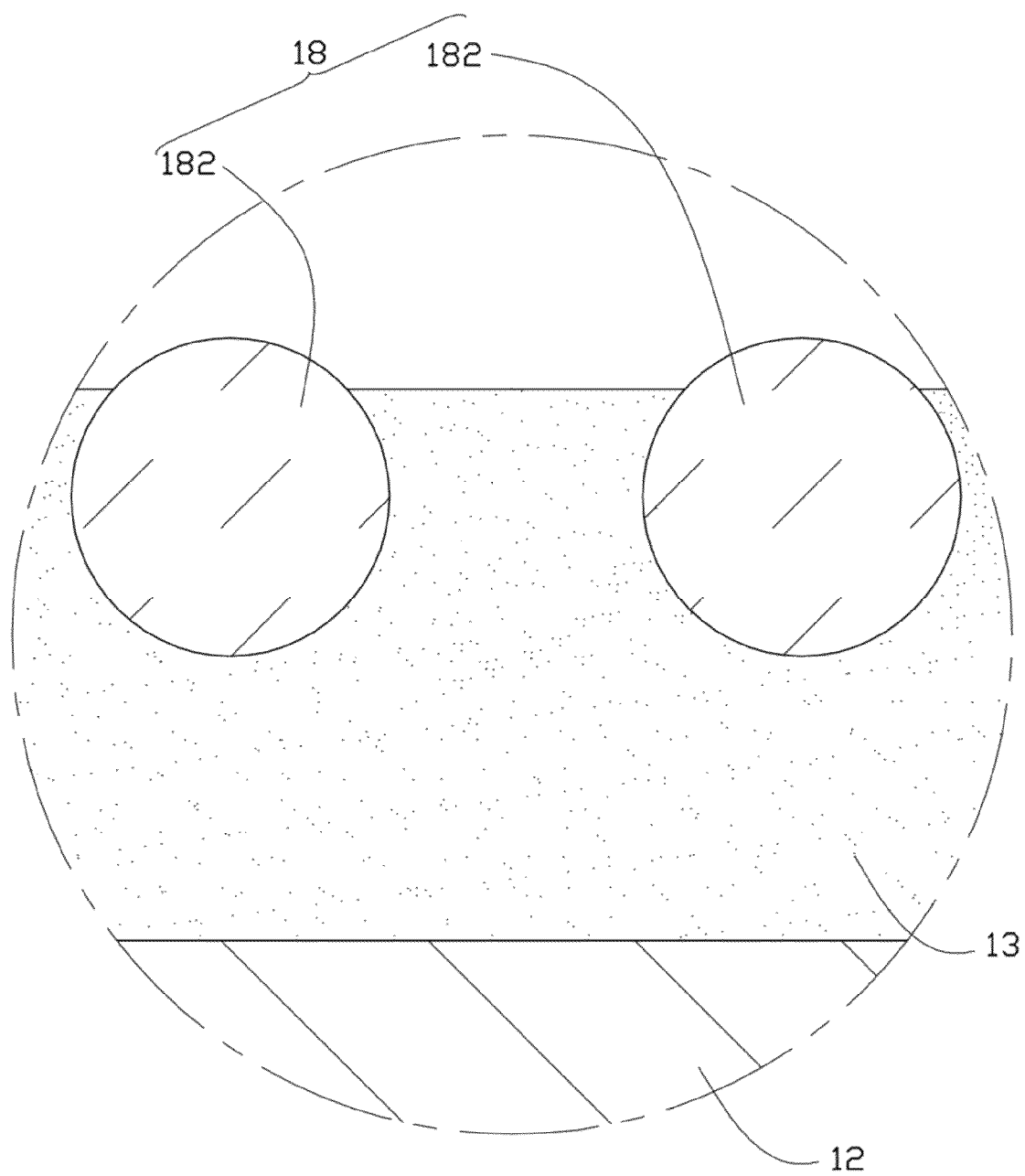
FIG. 2 is an enlargement view of the part II-II of FIG. 1.

Further referring to FIG. 2, the patterned carbon nanotube layer 18 includes a plurality of carbon nanotubes 182. The carbon nanotubes 182 in each carbon nanotube pattern are joined end-to-end by van der Waals attractive force therebetween to form an integral structure. A majority of the carbon nanotubes 182 are arranged to extend along the direction substantially parallel to the surface of the adhesive layer 13. A plurality of gaps is defined between adjacent carbon nanotubes 182 so that part of the adhesive layer 13 is exposed. The surface of the exposed adhesive layer 13 is substantially smooth. The plurality of gaps is filled with the adhesive layer 13, namely part of the adhesive layer 13 permeates into the patterned carbon nanotube layer 18. The single carbon nanotube 182 can be entirely embedded in the adhesive layer 13. Also, the single carbon nanotube 182 can have a first part embedded in the adhesive layer 13 and a second part exposed from the adhesive layer 13. In one embodiment, each of the carbon nanotubes 182 extends along a direction substantially parallel to the surface of the adhesive layer 13 and has a first part embedded in the adhesive layer 13 and a second part exposed from the adhesive layer 13.

The transmittance of the patterned carbon nanotube layer 18 can be greater than 75%. When the substrate 12, the adhesive layer 13, and the patterned carbon nanotube layer 18 allow light to pass through, the patterned conductive element 10 can be used as a transparent conductive element and applied in the electronic devices such as a touch screen, a LCD, or a FED.

Figure 5:
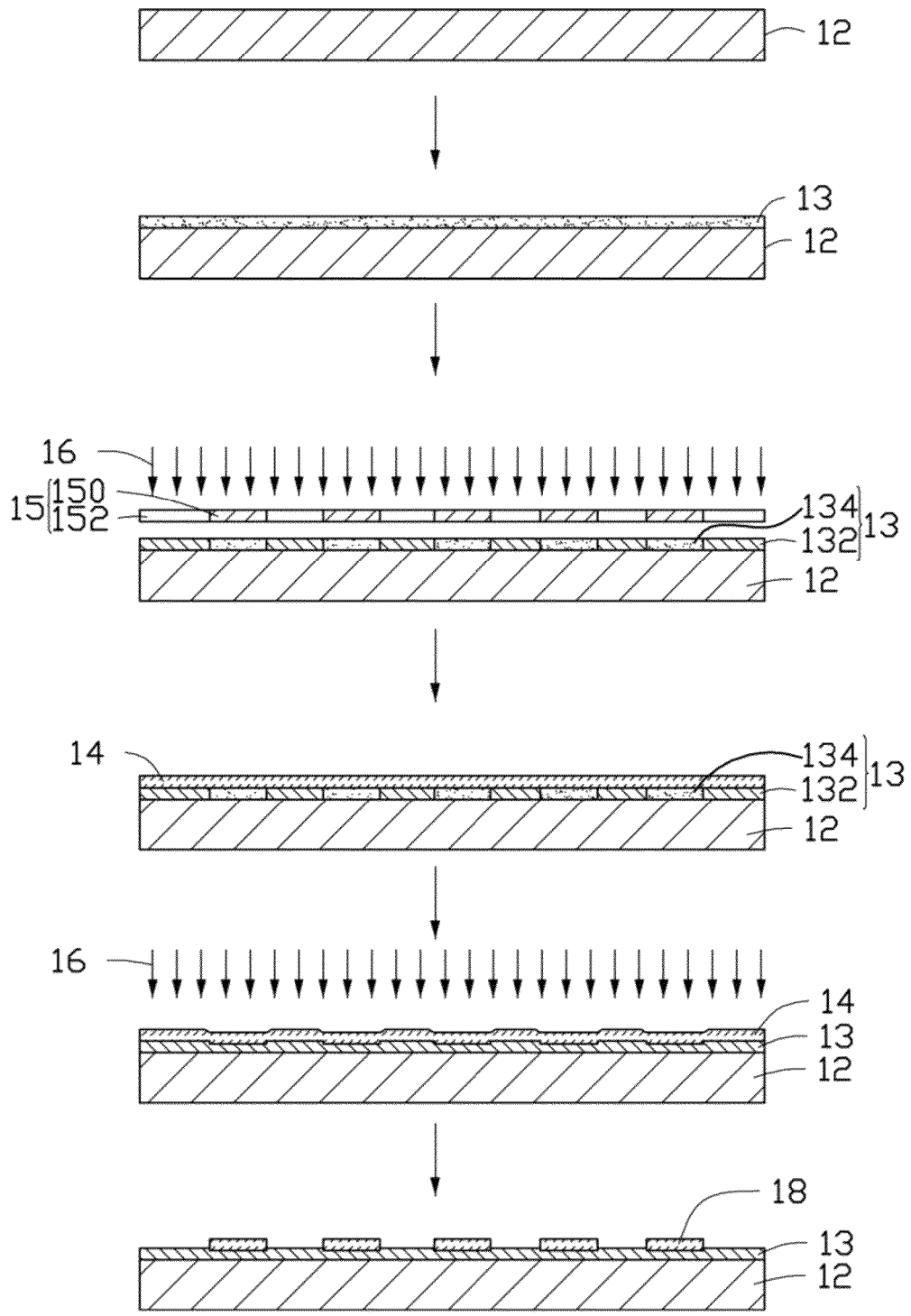
FIG. 5 is a flowchart of one embodiment of a method for making a patterned conductive element.

Referring to FIG. 5, a method for making the patterned conductive element 10 of one embodiment includes the steps of:

step (S10), providing a substrate 12;
step (S20), applying an adhesive layer 13 on a surface of the substrate 12;
step (S30), forming a solidified adhesive layer 132 and a non-solidified adhesive layer 134 by partially solidifying the adhesive layer 13;
step (S40), placing a carbon nanotube layer 14 on a surface of the adhesive layer 13;
step (S50), solidifying the non-solidified adhesive layer 134 so that the carbon nanotube layer 14 on the non-solidified adhesive layer 134 forms a fixed carbon nanotube layer and the carbon nanotube layer 14 on the solidified adhesive layer 132 forms a non-fixed carbon nanotube layer; and
step (S60), removing the non-fixed carbon nanotube layer on the solidified adhesive layer 132 to obtain a patterned carbon nanotube layer 18.

In Step (S10), the Substrate 12 is a Pet Film.

In step (S20), the adhesive layer 13 can be any adhesive which can be solidified on a certain condition. The adhesive layer 13 is transparent and can be made of materials such as hot plastic or UV glue, for example PVC or PMMA. The adhesive layer 13 can be formed by spin-coating, spraying, or brushing. In one embodiment, a UV glue layer with a thickness of 1.5 micrometers is formed on the substrate 12 by spin-coating.

In step (S30), the method for solidifying the adhesive layer 13 depends on the material of the adhesive layer 13. The thermoplastic adhesive layer 13 can be solidified by partially cooling, the thermosetting adhesive layer 13 can be solidified by partially heating by infrared radiation through a mask, and the UV glue adhesive layer 13 can be solidified by partially irradiating with ultraviolet light.

The non-solidified adhesive layer 134 has a pattern corresponding to that of the patterned carbon nanotube layer 18. The non-solidified adhesive layer 134 includes a plurality of predetermined patterns. The predetermined pattern can be a triangle, parallelogram, diamond, square, trapezoid, rectangle, or circle.

Figure 6:
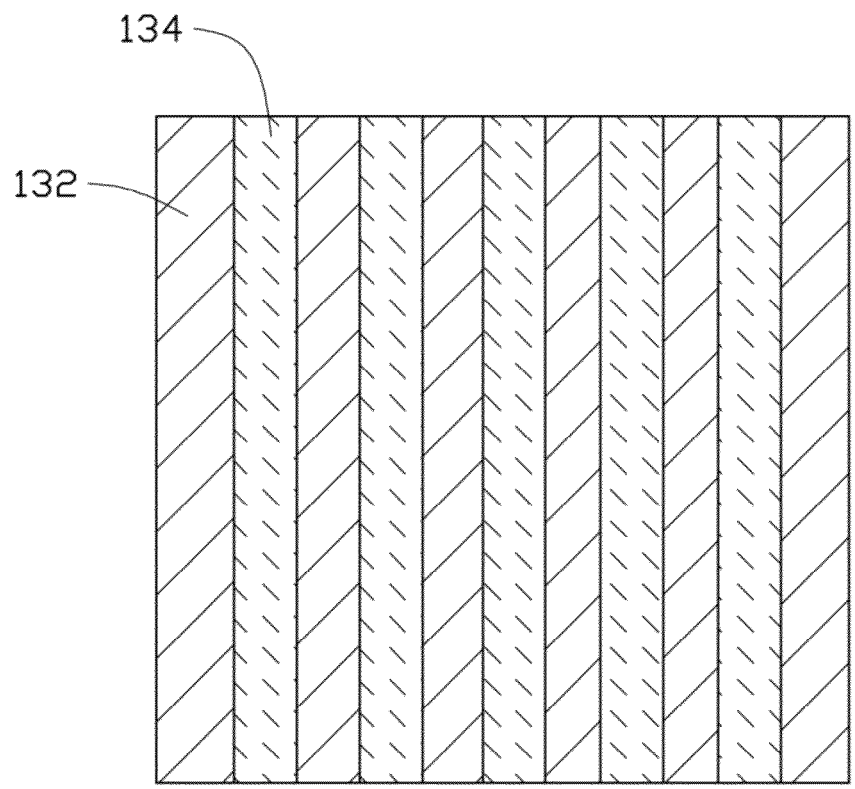
FIG. 6 is a schematic, top view of an adhesive layer having a solidified adhesive layer and a non-solidified adhesive layer.

Referring to FIG. 6, in one embodiment, the solidified adhesive layer 132 includes a plurality of first stripes spaced from each other, and the non-solidified adhesive layer 134 includes a plurality of second stripes spaced from each other. The first stripes and second stripes are located alternately. The adhesive layer 13 is UV glue layer and can be solidified by steps of:

step (S301), sheltering the adhesive layer 13 by a mask 15;
step (S302), irradiating the adhesive layer 13 with ultraviolet light 16; and
step (S303), removing the mask 15.

In step (S301), the mask 15 can be suspended above the adhesive layer 13. The shape and area of the mask 15 can be selected according to the patterned carbon nanotube layer 18. In one embodiment, the mask 15 includes a body 150 defining a plurality of holes 152. The body 150 is used to block the ultraviolet light 16. The holes 152 can allow the ultraviolet light 16 to pass through. In one embodiment, the mask 15 is a plate having a plurality of stripe-shaped openings.

In step (S302), the adhesive layer 13 can be irradiated for about 2 seconds to about 30 seconds. In one embodiment, the adhesive layer 13 is irradiated for about 4 seconds. The adhesive layer 13 corresponding to the holes 152 is solidified to form the solidified adhesive layer 132, and the adhesive layer 13 corresponding to the body 150 is not solidified and forms the non-solidified adhesive layer 134.

In step (S40), the carbon nanotube layer 14 can be formed by transfer printing a preformed carbon nanotube film, filtering and depositing a carbon nanotube suspension, or laying a free-standing carbon nanotube film. In one embodiment, the carbon nanotube film is drawn from a carbon nanotube array and then placed on the adhesive layer 13 directly. After the carbon nanotube layer 14 is placed on the adhesive layer 13, the carbon nanotube layer 14 on the solidified adhesive layer 132 is only located on surface of the solidified adhesive layer 132 and connected with the solidified adhesive layer 132 by van der Waals attractive force. The carbon nanotube layer 14 on the non-solidified adhesive layer 134 is infiltrated into the non-solidified adhesive layer 134 and will be fixed by the non-solidified adhesive layer 134 in following step (S50). In one embodiment, the carbon nanotube layer 14 on the non-solidified adhesive layer 134 include a plurality of carbon nanotubes infiltrated into and extending out of the non-solidified adhesive layer 134. Furthermore, a step of pressing the carbon nanotube layer 14 can be performed after step (S40) to allow more carbon nanotubes of the carbon nanotube layer 14 to infiltrate into the non-solidified adhesive layer 134.

The carbon nanotube layer 14 includes a plurality of carbon nanotubes. The carbon nanotube layer 14 can be a substantially pure structure of the carbon nanotubes, with few impurities and chemical functional groups. A majority of the carbon nanotubes are arranged to extend along the direction substantially parallel to the surface of the carbon nanotube layer 14. The carbon nanotubes in the carbon nanotube layer 14 can be single-walled, double-walled, or multi-walled carbon nanotubes. The length and diameter of the carbon nanotubes can be selected according to need, for example the diameter can be in a range from about 0.5 nanometers to about 50 nanometers and the length can be in a range from about 200 nanometers to about 900 nanometers. The thickness of the carbon nanotube layer 14 can be in a range from about 0.5 nanometers to about 100 micrometers, for example in a range from about 100 nanometers to about 200 nanometers. The carbon nanotube layer 14 has a good flexibility because of the good flexibility of the carbon nanotubes therein.

The carbon nanotubes of the carbon nanotube layer 14 can be arranged orderly to form an ordered carbon nanotube structure or disorderly to form a disordered carbon nanotube structure. The term 'disordered carbon nanotube structure' includes, but is not limited to, to a structure where the carbon nanotubes are arranged along many different directions, and the aligning directions of the carbon nanotubes are random. The number of the carbon nanotubes arranged along each different direction can be almost the same (e.g. uniformly disordered). The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotube layer 14 is a free-standing structure. The term "free-standing structure" means that the carbon nanotube layer 14 can sustain the weight of itself when it is hoisted by a portion thereof without any significant damage to its structural integrity. Thus, the carbon nanotube layer 14 can be suspended by two spaced supports.

The carbon nanotube layer 14 includes at least one free-standing carbon nanotube film. The free-standing carbon nanotube film can be drawn from a carbon nanotube array and then placed on the patterned adhesive layer 13 directly and easily. In one embodiment, the carbon nanotube film can be made by the steps of: growing a carbon nanotube array on a wafer by chemical vapor deposition method; and drawing the carbon nanotubes of the carbon nanotube array to from the carbon nanotube film. During the drawing step, the carbon nanotubes are joined end-to-end by van der Waals attractive force therebetween along the drawing direction. The carbon nanotube film has the smallest resistance along the drawing direction and the greatest resistance along a direction perpendicular to the drawing direction. Thus, the carbon nanotube film is resistance anisotropy. Furthermore, the carbon nanotube film can be etched or irradiated by laser. After being irradiated by laser, a plurality of parallel carbon nanotube conductive strings will be formed and the resistance anisotropy of the carbon nanotube film will not be damaged because the carbon nanotube substantially extending not along the drawing direction are removed by burning. Each carbon nanotube conductive string includes a plurality of carbon nanotubes joined end-to-end by van der Waals attractive force.

Figure 7:
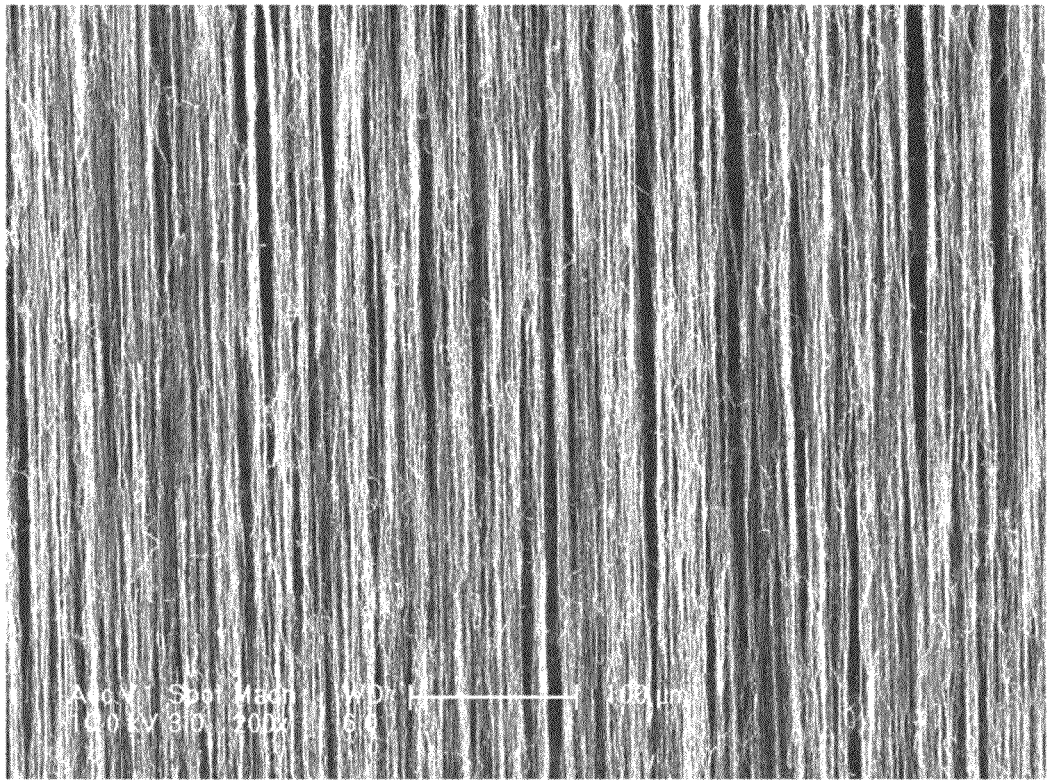
FIG. 7 is a Scanning Electron Microscope (SEM) image of a carbon nanotube film.

In one embodiment, the carbon nanotube layer 14 is a single carbon nanotube film. The carbon nanotube film includes a plurality of successive and oriented carbon nanotubes joined end-to-end by van der Waals attractive force therebetween. The carbon nanotube film is a free-standing film. Referring to FIG. 7, each carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the carbon nanotube film. The carbon nanotubes in the carbon nanotube film are oriented along a preferred orientation. The carbon nanotube film can be treated with an organic solvent to increase the mechanical strength and toughness and reduce the coefficient of friction of the carbon nanotube film. A thickness of the carbon nanotube film can range from about 0.5 nanometers to about 100 micrometers.

The carbon nanotube layer 14 can include at least two stacked carbon nanotube films. In other embodiments, the carbon nanotube layer 14 can include two or more coplanar carbon nanotube films. Additionally, when the carbon nanotubes in the carbon nanotube film are aligned along one preferred orientation, an angle can exist between the orientations of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked carbon nanotube films is larger than 0 degrees, a plurality of micropores is defined by the carbon nanotube film. Stacking the carbon nanotube films will also add to the structural integrity of the carbon nanotube film.

In step (S50), the method for solidifying the non-solidified adhesive layer 134 is same as the method for solidifying the adhesive layer 13 provided in step (S30). Because the carbon nanotube layer 14 on the non-solidified adhesive layer 134 is infiltrated into the non-solidified adhesive layer 134, the carbon nanotube layer 14 on the non-solidified adhesive layer 134 is fixed by the adhesive layer 13 to form the fixed carbon nanotube layer in step (S50). The carbon nanotube layer 14 on the solidified adhesive layer 132 will not be fixed by the adhesive layer 13 and will form the non-fixed carbon nanotube layer. In one embodiment, the non-solidified adhesive layer 134 is solidified by irradiating with ultraviolet light 16.

In step (S60), the non-fixed carbon nanotube layer on the solidified adhesive layer 132 can be removed by a method such as stripping by an adhesive tape or peeling by a roller having an adhesive outer surface. Because the bonding force between the non-fixed carbon nanotube layer and the solidified adhesive layer 132 is weak, the non-fixed carbon nanotube layer will be removed easily by the adhesive tape or the roller having an adhesive outer surface. In one embodiment, the non-fixed carbon nanotube layer is stripped by an adhesive tape. Compared to the process of forming ITO layer by ion-beam sputtering and etching ITO layer by laser beam, the process of making the patterned carbon nanotube layer 18 is simple and low cost. Furthermore, the non-fixed carbon nanotube layer can be removed by a method such as laser-beam etching, ion-beam etching, or electron-beam etching. The fixed carbon nanotube layer on the will be remained to form the patterned carbon nanotube layer 18.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:
1. A method for making a patterned conductive element, the method comprising:
   providing a substrate;
   applying an adhesive layer on a surface of the substrate;
   forming a solidified adhesive layer and a non-solidified adhesive layer by partially solidifying the adhesive layer;

placing a carbon nanotube layer on a surface of the adhesive layer;

solidifying the non-solidified adhesive layer so that the carbon nanotube layer on the non-solidified adhesive layer forms a fixed carbon nanotube layer and the carbon nanotube layer on the solidified adhesive layer forms a non-fixed carbon nanotube layer; and removing the non-fixed carbon nanotube layer to obtain a patterned carbon nanotube layer.

2. The method of claim 1, wherein the adhesive layer is formed by spin-coating, spraying, or brushing.

3. The method of claim 1, wherein the adhesive layer comprises thermoplastic and is solidified by cooling.

4. The method of claim 1, wherein the adhesive layer comprises thermosetting material and is solidified by heating.

5. The method of claim 1, wherein the adhesive layer comprises UV glue and is solidified by ultraviolet light irradiating.

6. The method of claim 5, wherein the partially solidifying the adhesive layer comprises:

sheltering the adhesive layer by a mask;

irradiating the adhesive layer with ultraviolet light; and removing the mask.

7. The method of claim 6, wherein the mask is suspended above the adhesive layer.

8. The method of claim 1, wherein the carbon nanotube layer is formed by filtering and depositing a carbon nanotube suspension.

9. The method of claim 1, wherein the carbon nanotube layer is formed by drawing a free-standing carbon nanotube film from a carbon nanotube array; and laying the free-standing carbon nanotube film on the adhesive layer directly.

10. The method of claim 9, wherein at least two free-standing carbon nanotube films are stacked on the adhesive layer.

11. The method of claim 1, wherein after applying the carbon nanotube layer on the adhesive layer, the carbon nanotube layer on the solidified adhesive layer is only located on a surface of the solidified adhesive layer, and the carbon nanotube layer on the non-solidified adhesive layer is infiltrated into the non-solidified adhesive layer.

12. The method of claim 11, wherein the carbon nanotube layer on the non-solidified adhesive layer comprises a plurality of carbon nanotubes infiltrated into and extending out of the non-solidified adhesive layer.

13. The method of claim 1, further comprising pressing the carbon nanotube layer after applying the carbon nanotube layer on the adhesive layer.

14. The method of claim 1, wherein the non-fixed carbon nanotube layer is removed by stripping using an adhesive tape.

15. The method of claim 1, wherein the non-fixed carbon nanotube layer is removed by peeling using a roller having an adhesive outer surface.

16. The method of claim 1, wherein the non-fixed carbon nanotube layer is removed by laser-beam etching, ion-beam etching, or electron-beam etching.

* * * * *